United States Patent
Van Dijk et al.

(10) Patent No.: US 10,788,761 B2
(45) Date of Patent: Sep. 29, 2020

(54) DETERMINING AN OPTIMAL OPERATIONAL PARAMETER SETTING OF A METROLOGY SYSTEM

(71) Applicant: ASML NETHERLANDS B.V., Veldhoven (NL)

(72) Inventors: Leon Paul Van Dijk, Eindhoven (NL); Victor Emanuel Calado, Rotterdam (NL); Xing Lan Liu, Ukkel (BE); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/344,831

(22) PCT Filed: Oct. 17, 2017

(86) PCT No.: PCT/EP2017/076419
§ 371 (c)(1),
(2) Date: Apr. 25, 2019

(87) PCT Pub. No.: WO2018/086825
PCT Pub. Date: May 17, 2018

(65) Prior Publication Data
US 2019/0250523 A1    Aug. 15, 2019

(30) Foreign Application Priority Data
Nov. 11, 2016    (EP) ..................................... 16198435

(51) Int. Cl.
*G03F 7/20*    (2006.01)
*G03F 9/00*    (2006.01)

(52) U.S. Cl.
CPC ...... *G03F 7/70783* (2013.01); *G03F 7/70508* (2013.01); *G03F 7/70633* (2013.01); *G03F 9/7046* (2013.01)

(58) Field of Classification Search
None
See application file for complete search history.

(56) References Cited

U.S. PATENT DOCUMENTS

2003/0223630 A1* 12/2003 Adel .................. G03F 7/70633
382/145
2007/0021860 A1* 1/2007 Gertrudus Simons ......................
G03F 7/70516
700/121

(Continued)

OTHER PUBLICATIONS

International Search Report and Written Opinion issued in corresponding PCT Patent Application No. PCT/EP2017/076419, dated Jan. 29, 2018.

(Continued)

*Primary Examiner* — Ryan A Jarrett
(74) *Attorney, Agent, or Firm* — Pillsbury Winthrop Shaw Pittman LLP

(57) ABSTRACT

A method of determining an optimal operational parameter setting of a metrology system is described. Free-form substrate shape measurements are performed. A model is applied, transforming the measured warp to modeled warp scaling values. Substrates are clamped to a chuck, causing substrate deformation. Alignment marks of the substrates are measured using an alignment system with four alignment measurement colors. Scaling values thus obtained are corrected with the modeled warp scaling values to determine corrected scaling values. An optimal alignment measurement color is determined, based on the corrected scaling values. Optionally, scaling values are selected that were measured using the optimal alignment measurement color (Continued)

and a substrate grid is determined using the selected scaling values. A substrate may be exposed using the determined substrate grid to correct exposure of the substrate.

20 Claims, 5 Drawing Sheets

(56) References Cited

U.S. PATENT DOCUMENTS

| | | | |
|---|---|---|---|
| 2007/0146708 A1 | 6/2007 | Hagiwara | |
| 2011/0051150 A1* | 3/2011 | Choi | G03F 7/70633 356/620 |
| 2013/0035888 A1* | 2/2013 | Kandel | G03F 7/70616 702/81 |
| 2013/0230797 A1 | 9/2013 | Van Der Sanden et al. | |
| 2016/0246185 A1 | 8/2016 | Ypma et al. | |
| 2018/0173099 A1* | 6/2018 | Affentauschegg | G03F 7/7055 |
| 2018/0329313 A1* | 11/2018 | Chang | G06F 30/398 |
| 2019/0196334 A1* | 6/2019 | Tel | G03F 7/2043 |
| 2020/0019067 A1* | 1/2020 | Kou | G03F 7/70633 |

OTHER PUBLICATIONS

Taiwanese Office Action issued in corresponding Taiwanese Patent Application No. 106137290, dated Aug. 20, 2018.
"Process Control Optimization Using Mark Deformation Information by a Relative Budget Breakdown", Research Disclosure No. 584051, vol. 584, No. 51, Nov. 19, 2012.

* cited by examiner

DETERMINING AN OPTIMAL OPERATIONAL PARAMETER SETTING OF A METROLOGY SYSTEM

CROSS-REFERENCE TO RELATED APPLICATIONS

This application is the U.S. national phase entry of PCT patent application no. PCT/EP2017/076419, which was filed on Oct. 17, 2017, which claims the benefit of priority of European patent application no. 16198435.6, which was filed on Nov. 11, 2016 and which is incorporated herein in its entirety by reference.

BACKGROUND

Field of the Invention

The present invention relates to methods of determining an optimal operational parameter setting of a metrology system for measuring metrology marks present on a substrate usable, for example, in the manufacture of devices by lithographic techniques. The present invention also relates to methods of determining a substrate grid, and methods of exposing a substrate. The present invention also relates to associated computer programs, computer program product and apparatus including a lithographic apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer, commonly referred to as "wafer"). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In this document, a semiconductor wafer is used as an example of a substrate.

In a lithographic apparatus being used to process a wafer, the goal of the wafer alignment subsystem may be to provide an accurate description of the wafer grid. The wafer grid maps a distribution of alignment marks across a wafer. The wafer grid is translated into a proper description per field for correcting exposure. An important prerequisite is an accurate and reliable measurement of the alignment marks on the wafer by the alignment system.

Semiconductor manufacturing processes such as etching and Chemical-Mechanical Planarization (CMP) are known to cause alignment mark deformation. This causes the alignment to measure the mark positions wrongly, leading to large overlay errors in subsequent layers. Etching, for example, is known to cause a wafer-scaling "fingerprint", which is a linear scaling of the wafer grid, leading to a correctable wafer-scaling overlay error. For example, with a shallow trench isolation etch, the scaling fingerprint is very prominent. However, for gate etch, the scaling fingerprint is less apparent. Beyond linear scaling, the etch process may cause higher order scaling in mark deformation. Fingerprints may arise from wafer deformations, which also lead to alignment mark position displacements (APD). Known alignment systems may be incapable of distinguishing between APDs resulting from alignment marker deformation or wafer deformation. The sensitivity of the position error to marker deformation may depend on the wavelength and/or polarization of the alignment color.

In a conventional lithographic process, the optimal alignment color is determined after measuring overlay, thus after exposure. If the optimal color was not used and the overlay errors are too high, the wafers need to be reworked or scrapped.

SUMMARY

The inventors have devised a way of determining an optimal operational parameter setting of a metrology system for measuring metrology marks present on a substrate. It may be used for example to select the color that is least or not sensitive to alignment mark deformation and thus may enable more accurate and reliable aligned position measurements, while avoiding or at least mitigating one or more of the associated problems mentioned above.

The invention in a first aspect provides a method of determining an optimal operational parameter setting of a metrology system for measuring metrology marks present on a substrate, the method comprising the steps of:
  obtaining first data from measurements of each of a plurality of substrates;
  obtaining second data for a plurality of operational parameter settings of the metrology system from second measurements of metrology marks on each of the plurality of substrates using the metrology system configured with the plurality of operational parameter settings;
  correcting the second data with the first data to determine corrected data; and
  determining an optimal operational parameter setting of the plurality of operational parameter settings, based on the corrected data.

The metrology marks may be affected by a plurality of sources of variation having differing measurement sensitivities of substrate-to-substrate variation, as a function of the operational parameter setting of the metrology system. The first data may comprise information on variation arising from a first source of variation that has relatively less or no dependence of measurement sensitivity of substrate-to-substrate variation on the operational parameter setting of the metrology system, compared to another source of variation. The second data may comprise information on variation arising from the plurality of sources of variation.

The invention in a second aspect provides a method of determining a substrate grid, the substrate grid mapping a distribution of metrology marks across a substrate, the method comprising the method of the first aspect and further comprising the steps:
  selecting second data that was measured using the determined optimal operational parameter setting; and
  using the selected second data to determine a substrate grid.

The invention in a third aspect provides a method of exposing a substrate, the method comprising the method of the second aspect and further comprising the step of exposing a substrate using the determined substrate grid to correct exposure of the substrate.

The invention in a fourth aspect provides a computer program comprising computer readable instructions which, when run on suitable computer apparatus, cause the computer apparatus to perform the method of the first, second or third aspect.

The invention in a fifth aspect provides a computer program product comprising the computer program of the fourth aspect.

The invention in a sixth aspect provides an apparatus specifically adapted to carry out the steps of the method according to the first, second or third aspect. The apparatus may be configured as a lithographic apparatus operable to perform a lithographic process on said substrates.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
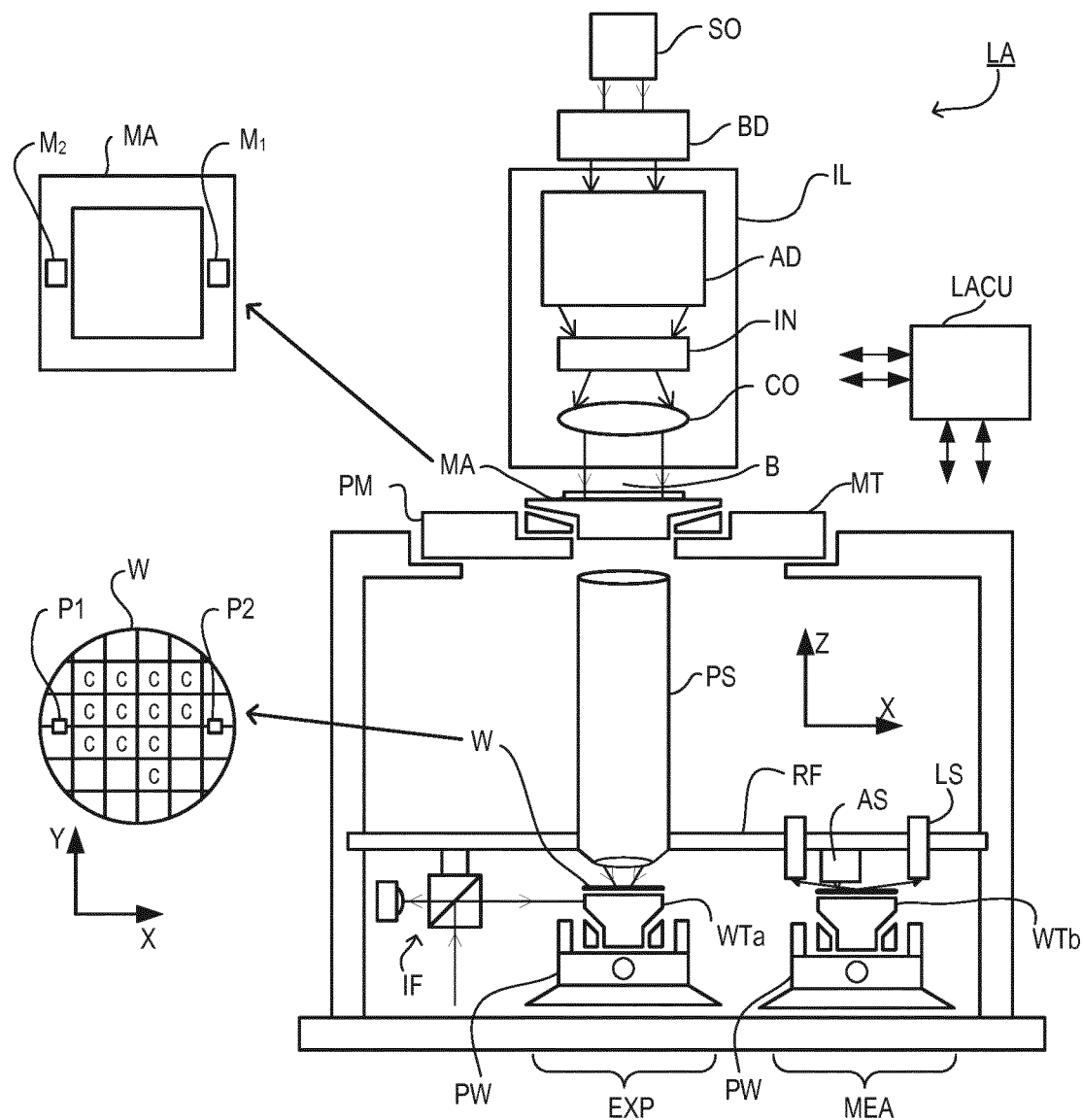
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
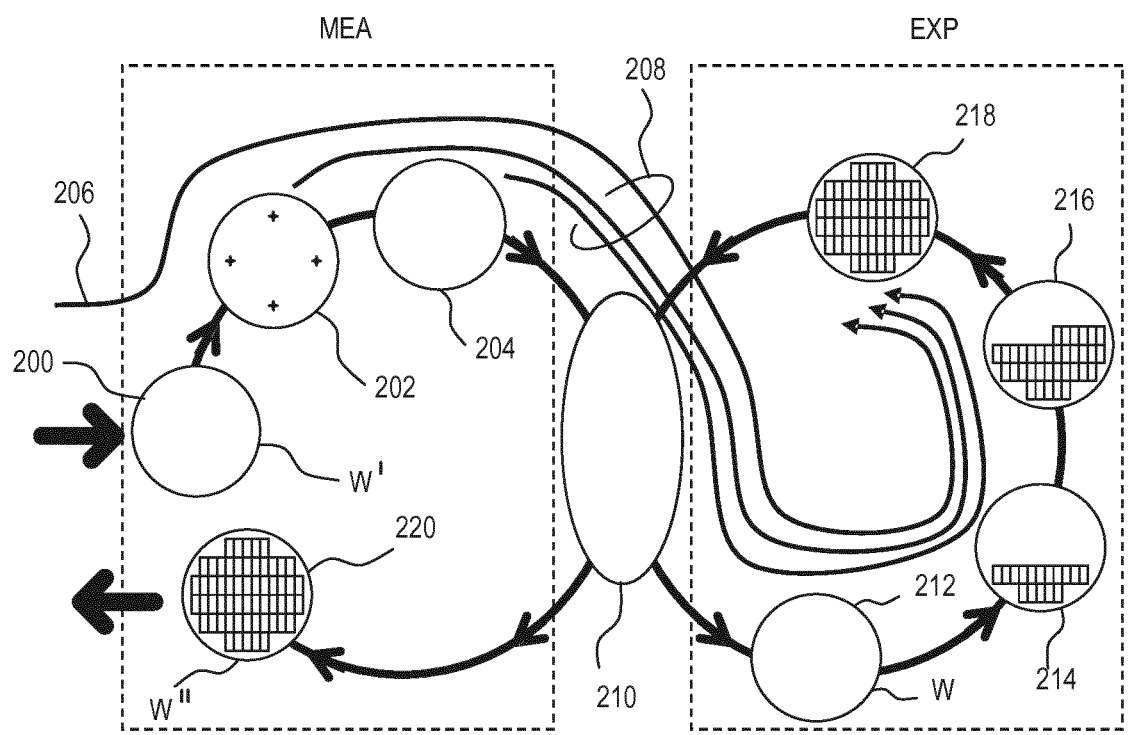
FIG. 2 illustrates schematically measurement and exposure processes in the apparatus of FIG. 1, according to known practice.

FIG. 2 illustrates the steps to expose target portions (e.g. dies) on a substrate W in the dual stage apparatus of FIG. 1. The process according to conventional practice will be described.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithographic apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithographic apparatuses, as just mentioned, and may even be performed in different types of lithographic apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor IS. Conventionally, the height map is used only to achieve accurate focusing of the exposed pattern. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

An embodiment of the present invention will now be described that selects the optimal alignment measurement color (frequency) based on wafer-shape measurements. It reduces the impact of alignment mark deformation on wafer-to-wafer variation. Another embodiment may select the optimal alignment measurement color (frequency) and/or polarization based on wafer-shape measurements.

As mentioned above, etching may cause wafer scaling fingerprints due to alignment marker deformation, and the magnitude of the scaling that is measured and its variation from wafer-to-wafer may depend on the alignment measurement color used. To obtain good overlay, the alignment system should correct for wafer scaling caused by potential wafer warp but not for the wafer scaling that is wrongly measured due to alignment marker deformation.

In embodiments of the present invention, wafer-shape inspection tools may be used to select the alignment measurement color that is least or not impacted by wafer-to-wafer variation introduced by alignment marker deformation.

Figure 3:
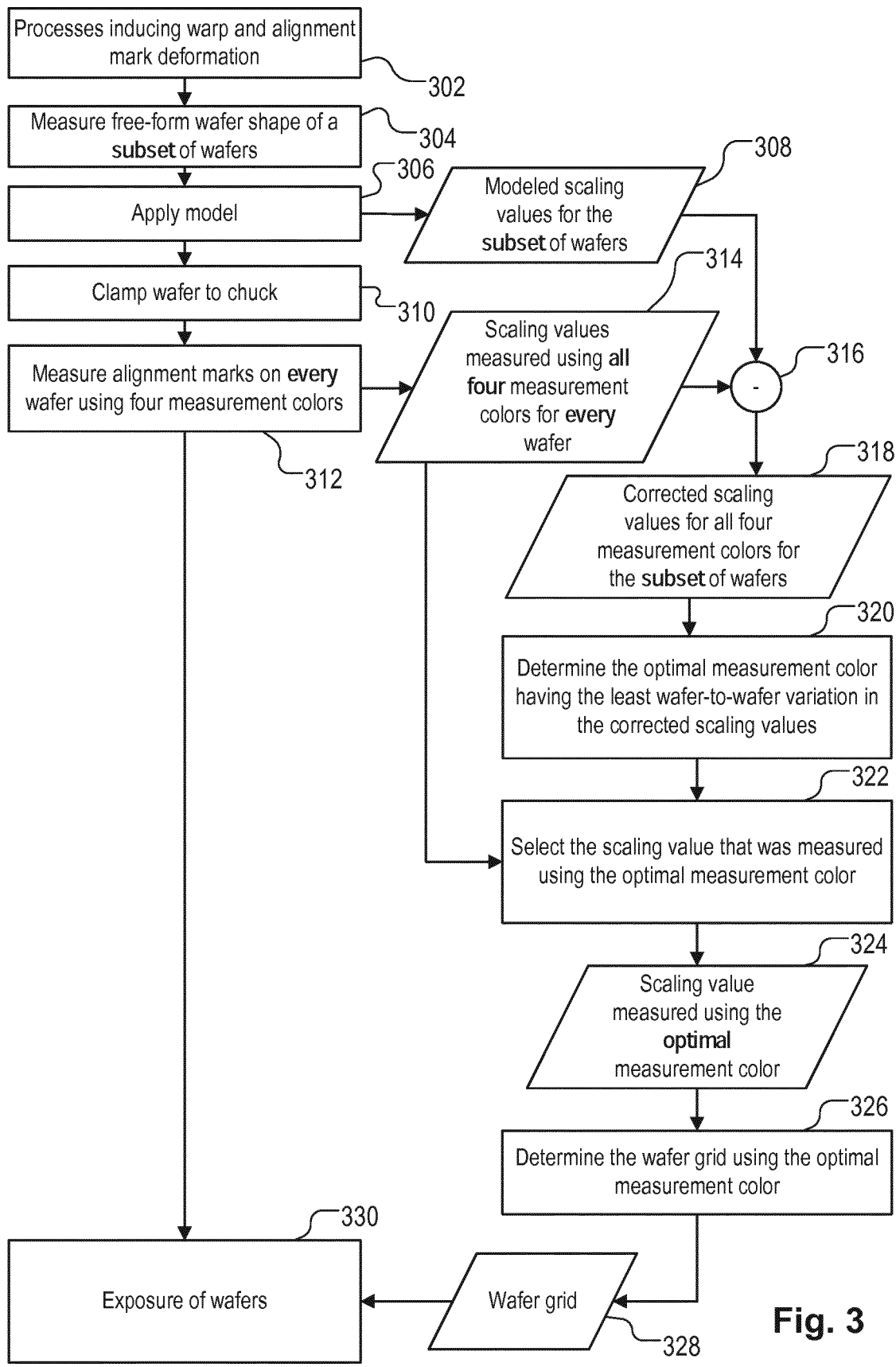
FIG. 3 illustrates a flow chart of a method in accordance with an embodiment of the present invention.

FIG. 3 illustrates a flow chart of a method in accordance with an embodiment of the present invention. The method determines an optimal operational parameter setting, in this example alignment color, of a metrology system for measuring metrology marks, in this example alignment marks, present on a wafer.

The metrology marks are affected by a plurality of sources of variation, in this example (in-plane) wafer deformation and mark deformation, having differing measurement sensitivities of substrate-to-substrate variation, as a function of the operational parameter setting of the metrology system. In this example, warp-induced wafer deformation is not color-sensitive, but mark deformation is color-sensitive.

With reference to FIG. 3, at step 302, wafers undergo processes in a semiconductor manufacturing facility that induce wafer deformation, such as warp in the wafers, and alignment mark deformation.

At step 304, free-form wafer shape measurements of a subset of wafers are performed. The free-form shape of wafers can be measured by metrology tools that are available in a typical semiconductor manufacturing facilities. Alternatively the free-form shape may be derived from other measurements of the subset of wafers. An alternative measurement may be based on a leveling measurement within the lithographic apparatus. This leveling measurement is performed for each substrate and determines a height map of the substrate. The height map is used for controlling the substrate position relative to a focal plane of the projection lens during a subsequent exposure of the substrate. The height map may be used as an alternative to the free-form wafer shape measurement or used to reconstruct the free-form wafer shape.

The subset may be wafers from a production batch and/or monitor wafers run in parallel with the production run. Warp can be derived from the free-form shape. Warp may be defined as the difference between the maximum and the minimum distances of the median surface of a free, un-clamped wafer from the reference plane, which is defined by three corners of equilateral triangle.

For a typical umbrella or bowl-like shape, which can be described by a paraboloid, $z=W*(x^+y^)$, warp equals W.

Pulling a warped wafer having thickness H, of which the shape is described by the function $W(x,y)$, flat on the chuck of a lithographic apparatus will result in wafer deformation. This deformation can be modeled.

At step 306, a model is applied, transforming the measured warp to modeled warp scaling values 308. In effect, this is modeling the physical process of conforming the warped wafer to the flat chuck. The modeled warp scaling values 308 are examples of wafer-shape deformation values. The wafer-shape deformation values in this example comprise warpage deformation values obtained by free-form wafer shape measurements of the wafers.

As an example of a simple model, for a first approximation, in-plane deformation (IPD) can be described by the equation:

$$IPD = -\frac{H}{6}\nabla W$$

This implies that for most common wafer shapes encountered (umbrella, bowl) the main deformation is a linear scaling and its magnitude is directly related to the wafer warp. As an example, the equation can be reduced to:

modeled warp scaling (ppm)=−0.01148×measured warp (μm).

Thus data, in this example modeled warp scaling values 308, are obtained from free-form wafer shape measurements 304 of each of a plurality of substrates, i.e. the subset of wafers. For an umbrella-shaped wafer, W in the paraboloid function above is negative, and the modelled scaling will be positive. Vice versa, the modelled scaling will be negative for bowl-shaped wafers.

In the example described above, we focus on wafer scaling only. The simple model gives the modeled scaling based on the wafer warp. Scaling is a first-order, linear distortion. Other models may be used such that higher-order wafer deformations can be predicted from the free-form wafer shape measurements. In that case, the method can be refined and expanded further by also looking to other (higher order) correctables.

At step 310, wafers are clamped to a chuck in the lithographic apparatus. As mentioned above, this clamping of a warped wafer flat on the chuck of a lithographic apparatus will result in wafer deformation.

At step 312, a second set of measurements is performed. Metrology marks, in this example alignment marks, are measured on each of the wafers using the metrology system, in this example the scanner alignment system. The scanner alignment system is configured with a plurality of operational parameter settings, in this example four alignment measurement colors to produce four sets of measurement results.

The measurements at step 312 are used to obtain scaling values for each wafer 314 for the plurality of alignment measurement colors of the scanner alignment system. This is done for each of the wafers for which warp measurements were performed and all the wafers in the production batch. The scaling values 314 are examples of overall deformation values.

At step 316, the scaling values data 314 are corrected with the modeled warp scaling values 308 to determine corrected scaling values 318. This is done for each of the four alignment measurement colors. The step of correcting the scaling values data 314 comprises subtracting modeled warp scaling values 308 from the scaling values data 314 of that substrate.

At step 320, when the subset of wafers that have had warp and alignment measurements done is big enough, the optimal alignment measurement color is determined, based on the corrected scaling values 318. The number of wafers is big enough when the wafer-to-wafer variation of corrected scaling values can be determined with sufficient accuracy to identify the color that results in significantly less wafer-to-wafer variation. That color is selected as the optimal alignment measurement color.

Thus, the modeled scaling values data 308 comprise information on variation arising from a first source of variation (warp) that has relatively less or no dependence of measurement sensitivity of substrate-to-substrate variation on the operational parameter setting of the metrology system (alignment measurement color), compared to another source of variation (mark deformation). The scaling values data 314 comprise information on variation arising from the plurality of sources of variation (warp-induced wafer deformation and mark deformation).

Subjecting the wafers to a clamping process to the chuck adds the effect (warp-induced scaling) of the first source of variation (warp) to the alignment marks for the second set of (alignment) measurements.

The operational parameter may be a property of measurement radiation used to measure the metrology marks. When the measurement radiation is electromagnetic radiation, the property may be frequency (color) as described above, or polarization, or the proportions of intensities of different frequencies and polarizations. For example, in the latter case, 0.1*red, 0.4*green+0.5*blue. In the example described above, there are four colors: Red, Green, Near Infra-Red (NIR) and Far Infra-Red (FIR). Red and FIR have the same polarization, and Green and NIR have the same polarization. In another example, for all colors (more than 4), both polarizations (Transverse-Magnetic and Transverse-Electric) may be available and used.

The remaining steps shown in FIG. 3 relate to determining a wafer grid and its use in the subsequent exposure of wafers.

At step 322, the scaling values data 325 are is selected that were measured using the determined optimal alignment measurement color. At step 326, the wafer grid 328 is determined using the selected scaling values data 324.

At step 330, a wafer is exposed using the determined wafer grid 328 to correct exposure of the wafer. The exposed wafer may be a wafer measured at step 304 and from which the modeled scaling values 308 were obtained. The exposed wafer may be a wafer, such as a product wafer, which had processing 302 that induces alignment mark deformation in common with the wafers, such as monitor wafers, from which modeled wafer scaling values data 308 were obtained.

Figure 4:
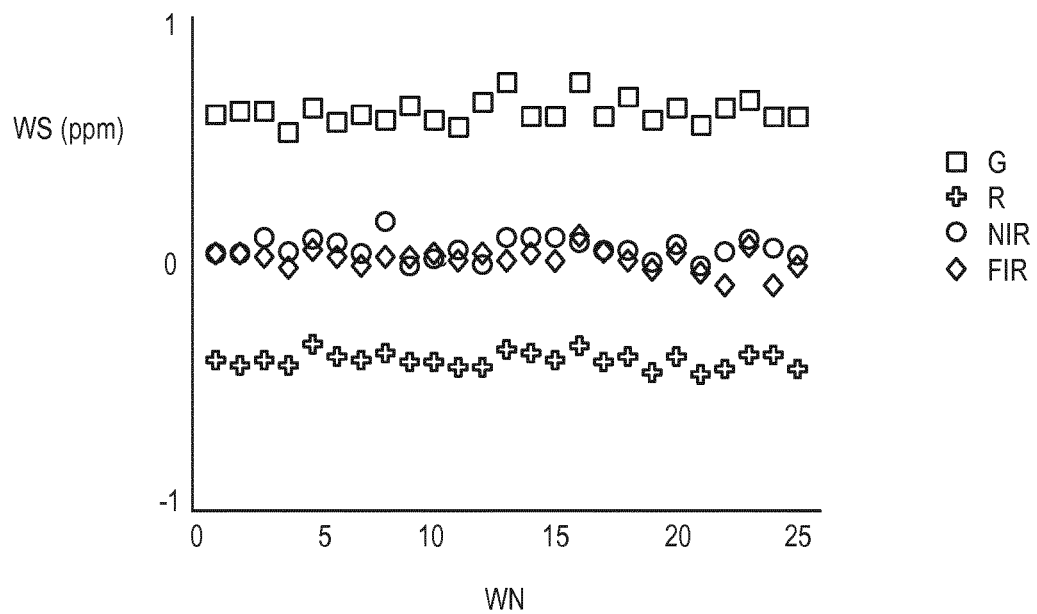
FIG. 4 is a graph of wafer scaling values for a batch of wafers obtained with different alignment measurement colors.
Figure 5:
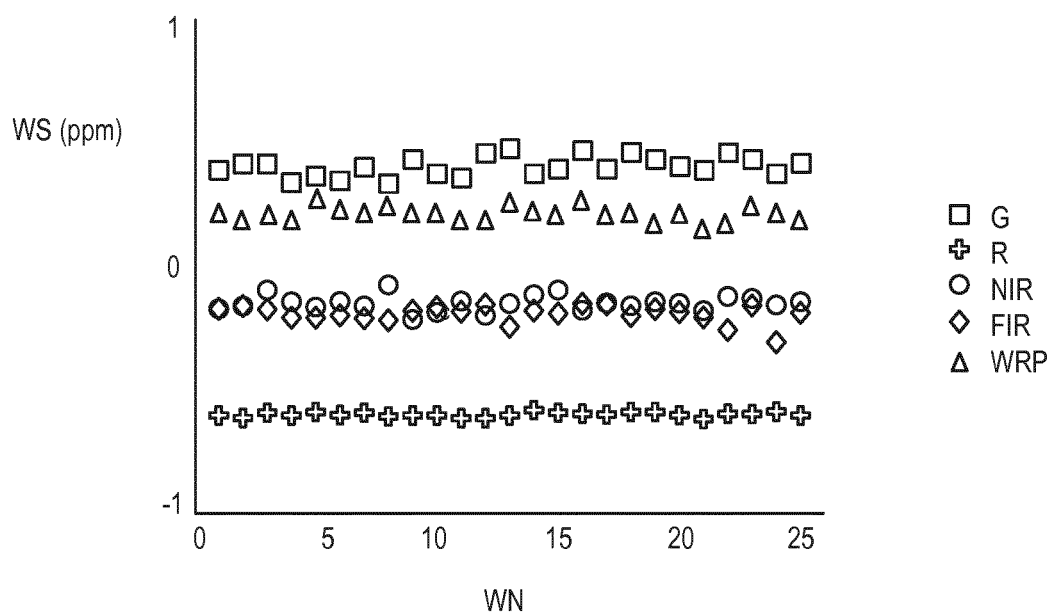
FIG. 5 is a graph of wafer scaling values, corrected using wafer warp measurements, for the batch of wafers.

FIG. 4 shows the wafer scaling values per alignment color for a batch of wafers as measured on a lithographic apparatus. The horizontal axis in FIGS. 4 and 5 is wafer number, WN, and the vertical axis is wafer scaling value, WS, in parts per million. The colors are green, G, red, R, Near Infra-Red, NIR, and Far Infra-Red, FIR. All colors indicate a significant wafer-to-wafer variation for the wafer scaling and all colors have similar variation levels. From the alignment data alone, one cannot distinguish whether the variation is caused by variation in wafer warp, for which one should correct, or by marker deformation, for which one should not correct.

FIG. 5 is a graph of wafer scaling values, corrected using wafer warp measurements, for the wafer lot. When the warp of the wafers is known, for example by measuring warp on wafer-shape inspection tools, one can correct for the warp contribution to scaling. FIG. 5 shows the scaling when the warp contribution is subtracted. In this way, the contribution to wafer scaling from alignment marker deformation is isolated for each color. It becomes immediately clear that red is least impacted by wafer-to-wafer variation introduced by marker deformation: all variation picked up by red (as shown in FIG. 4) should be corrected for as it is caused by variation in warp. For completeness, the scaling per wafer based on warp WPR is shown in FIG. 5 as well.

Note that although alignment marker deformation does not lead to significant wafer-to-wafer variation for alignment color red it does cause a fixed offset. However, this fixed offset can easily be corrected using automatic process control.

Figure 6:
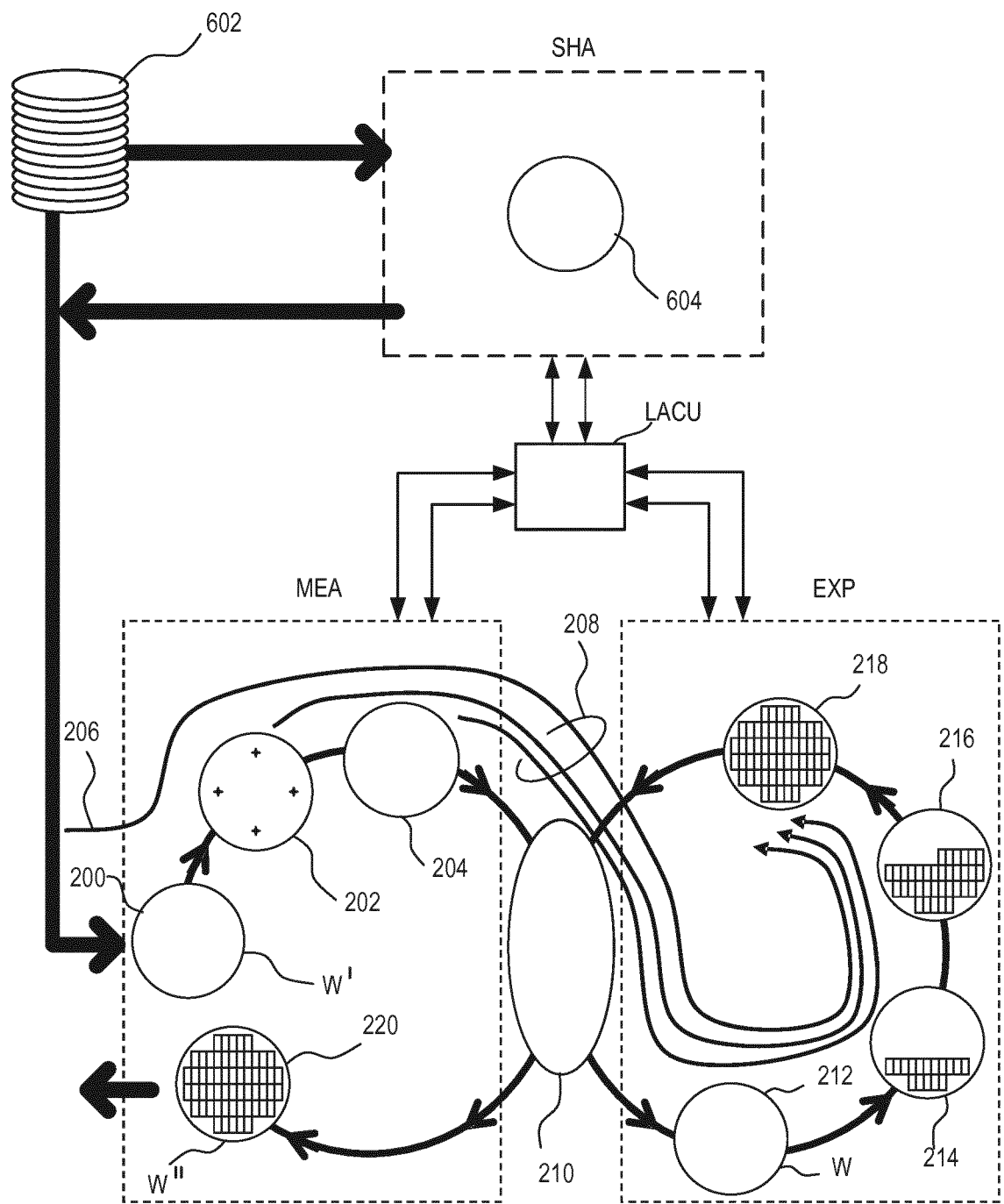
FIG. 6 illustrates schematically measurement and exposure processes in the apparatus of FIG. 1, as shown in FIG. 2, but modified in accordance with an embodiment of the present invention.

FIG. 6 illustrates schematically measurement and exposure processes in the apparatus of FIG. 1, as shown in FIG. 2, but modified in accordance with an embodiment of the present invention. A batch of wafers 602 is shown and in this example, one wafer 604 per batch is taken for free-form wafer shape measurements SHA before entering the measurement and exposure process. The measurement and exposure processes have the same features as described with reference to FIG. 2. The controller LACU runs software that controls the process described with reference to FIG. 3.

The optimal alignment measurement color cannot be determined and used to correct exposures straight away in a dual-stage lithographic apparatus such as shown in FIG. 6. This is because wafers go straight from align MEA to exposure EXP and there is no time to build up data on wafer-to-wafer variation. Training wafers with free-form wafer shape measurements are aligned before the optimal color can be determined. However, once up and running, one wafer per lot can have warpage measured as described with reference to FIG. 6. Also, or alternatively, non-product monitor wafers may be used in parallel with the production.

Minimizing the impact of alignment marker deformation results in smaller overlay errors, which are directly related to higher yields. Embodiments of the present invention may also improve the logistic flow in the semiconductor fabrication facility as wafer reworks can be prevented.

An embodiment of the invention may be implemented using a computer program containing one or more sequences of machine-readable instructions describing methods of determining an optimal operational parameter setting of a metrology system and determining a substrate grid as described above. This computer program may be executed for example within the control unit LACU of FIG. 1 or 6, or some other controller. There may also be provided a data storage medium (e.g., semiconductor memory, magnetic or optical disk) having such a computer program stored therein.

Further embodiments are disclosed in the list of numbered embodiments below:

1. A method of determining an optimal operational parameter setting of a metrology system for measuring metrology marks present on a substrate, the method comprising the steps of:
   obtaining first data from measurements of each of a plurality of substrates;
   obtaining second data for a plurality of operational parameter settings of the metrology system from second measurements of metrology marks on each of the plurality of substrates using the metrology system configured with the plurality of operational parameter settings;
   correcting the second data with the first data to determine corrected data; and
   determining an optimal operational parameter setting of the plurality of operational parameter settings, based on the corrected data.

2. The method of embodiment 1, wherein:
   the metrology marks are affected by a plurality of sources of variation having differing measurement sensitivities of substrate-to-substrate variation, as a function of the operational parameter setting of the metrology system;
   the first data comprise information on variation arising from a first source of variation that has relatively less or no dependence of measurement sensitivity of substrate-to-substrate variation on the operational parameter setting of the metrology system, compared to another source of variation; and
   the second data comprise information on variation arising from the plurality of sources of variation.

3. The method of embodiment 2, further comprising the step of subjecting the plurality of substrates to a process that adds the effect of the first source of variation to the metrology marks for the second measurements.

4. The method of any preceding embodiment, wherein the operational parameter comprises a property of measurement radiation used to measure the metrology marks.

5. The method of embodiment 4, wherein the measurement radiation comprises electromagnetic radiation and the property comprises frequency.

6. The method of embodiment 4, wherein the measurement radiation comprises electromagnetic radiation and the property comprises polarization.

7. The method of embodiment 4, wherein the measurement radiation comprises electromagnetic radiation and the property comprises proportions of different frequencies.

8. The method of any preceding embodiment wherein the step of correcting the second data comprises subtracting the first data from the second data of that substrate.

9. The method of any preceding embodiment, wherein the step of determining an optimal operational parameter setting of the plurality of operational parameter settings, is based on substrate-to-substrate variation the corrected data.

10. The method of any preceding embodiment, wherein the first data comprises wafer-shape deformation values and the second data comprises overall deformation values.

11. The method of any preceding embodiment, wherein the first data comprises height map data of the substrate and the second data comprises overall deformation values.

12. The method of embodiment 10 or 11, wherein, the deformation values comprise scaling values.

13. The method of embodiment 10 or embodiment 12, wherein the wafer-shape deformation values comprise deformation values obtained by free-form substrate shape measurements of the substrates.

14. A method of determining a substrate grid, the substrate grid mapping a distribution of metrology marks across the substrate, the method comprising the method of any preceding embodiment and further comprising the steps:
   selecting second data that was measured using the determined optimal operational parameter setting; and
   using the second data to determine the substrate grid.

15. A method of exposing a substrate, the method comprising the method of embodiment 14 and further comprising the step of exposing a substrate using the determined substrate grid to correct exposure of the substrate.

16. The method of embodiment 15 wherein the exposed substrate comprises a substrate from which first data was obtained.

17. The method of embodiment 15 wherein the exposed substrate comprises a substrate which had processing that induces metrology mark deformation in common with the substrates from which first data was obtained.

18. A computer program comprising computer readable instructions which, when run on suitable computer apparatus, cause the computer apparatus to perform the method of any one of embodiments 1 to 17.

19. A computer program product comprising the computer program of embodiment 18.

20. Apparatus specifically adapted to carry out the steps of the method according to any of embodiments 1 to 17.

21. Apparatus according to embodiment 20 specifically configured as a lithographic apparatus operable to perform a lithographic process on said substrate.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining an optimal operational parameter setting of a metrology system for measuring metrology marks present on a substrate, the method comprising:
    obtaining first data from measurements of each of a plurality of substrates;
    obtaining second data for a plurality of operational parameter settings of the metrology system from second measurements of metrology marks on each of the plurality of substrates using the metrology system configured with the plurality of operational parameter settings;
    correcting, by a hardware computer system, the second data with the first data to determine corrected data; and
    determining, by the hardware computer system and based on the corrected data, an optimal operational parameter setting of the plurality of operational parameter settings.

2. The method of claim 1, wherein:
    the metrology marks are affected by a plurality of sources of variation having differing measurement sensitivities of substrate-to-substrate variation, as a function of the operational parameter setting of the metrology system;
    the first data comprise information on variation arising from a first source of variation that has relatively less or no dependence of measurement sensitivity of substrate-to-substrate variation on the operational parameter setting of the metrology system, compared to another source of variation; and
    the second data comprise information on variation arising from the plurality of sources of variation.

3. The method of claim 2, further comprising subjecting the plurality of substrates to a process that adds the effect of the first source of variation to the metrology marks for the second measurements.

4. The method of claim 1, wherein the operational parameter comprises a property of measurement radiation used to measure the metrology marks.

5. The method of claim 4, wherein the measurement radiation comprises electromagnetic radiation and the property comprises frequency.

6. The method of claim 4, wherein the measurement radiation comprises electromagnetic radiation and the property comprises proportions of different frequencies.

7. The method of claim 1, wherein correcting the second data comprises subtracting the first data from the second data of that substrate.

8. The method of claim 1, wherein determining an optimal operational parameter setting of the plurality of operational parameter settings, is based on substrate-to-substrate variation of the corrected data.

9. The method of claim 1, wherein the first data comprise substrate shape deformation values and the second data comprise overall deformation values.

10. The method of claim 9, wherein, the deformation values comprise scaling values.

11. The method of claim 9, wherein the substrate shape deformation values comprise deformation values obtained by free-form substrate shape measurements of the substrates.

12. The method of claim 1, wherein the first data comprise height map data of the substrate and the second data comprise overall deformation values.

13. A method of determining a substrate grid, the substrate grid mapping a distribution of metrology marks across the substrate, the method comprising:
    performing the method of claim 1;
    selecting second data that was measured using the determined optimal operational parameter setting; and
    using the second data to determine the substrate grid.

14. A non-transitory computer-readable medium comprising instructions therein, the instructions, upon execution by a computer system, configured to cause the computer system to at least:
    obtain first data from measurements of each of a plurality of substrates;
    obtain second data for a plurality of operational parameter settings of a metrology system for measuring metrology marks present on a substrate from second measurements of metrology marks on each of the plurality of substrates using the metrology system configured with the plurality of operational parameter settings;
    correct the second data with the first data to determine corrected data; and
    determine, based on the corrected data, an optimal operational parameter setting of the plurality of operational parameter settings.

15. The computer-readable medium of claim 14, wherein:
    the metrology marks are affected by a plurality of sources of variation having differing measurement sensitivities of substrate-to-substrate variation, as a function of the operational parameter setting of the metrology system;
    the first data comprise information on variation arising from a first source of variation that has relatively less or no dependence of measurement sensitivity of substrate-to-substrate variation on the operational parameter setting of the metrology system, compared to another source of variation; and
    the second data comprise information on variation arising from the plurality of sources of variation.

16. The computer-readable medium of claim 14, wherein the operational parameter comprises a property of measurement radiation used to measure the metrology marks.

17. The computer-readable medium of claim 14, wherein the determination of an optimal operational parameter setting of the plurality of operational parameter settings, is based on substrate-to-substrate variation of the corrected data.

18. The computer-readable medium of claim 14, wherein the first data comprise substrate-shape deformation values and the second data comprise overall deformation values.

19. A metrology apparatus comprising:
a radiation detector; and
the non-transitory computer-readable medium of claim 14.

20. A lithographic apparatus comprising:
a pattern transfer system configured to provide a pattern to a substrate; and
the metrology apparatus of claim 14.

* * * * *